United States Patent [19]
Mitani et al.

[11] Patent Number: 5,851,503
[45] Date of Patent: *Dec. 22, 1998

[54] FULLERENE COMPOUND, MANUFACTURING METHOD, AND USE

[75] Inventors: Tadaoki Mitani, 1-50, Asahidai, Tatsunokuchi, Nohmi; Keisuke Suzuki, Ishikawa; Johnson Ahn, Ishikawa; Yoshihiro Iwasa, Ishikawa, all of Japan

[73] Assignees: Ishikawa Seisakusho; Tadaoki Mitani, both of Ishikawa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 718,094

[22] Filed: Sep. 9, 1996

[30] Foreign Application Priority Data

Jun. 13, 1996 [JP] Japan .................................. 8-175933

[51] Int. Cl.$^6$ ................................................. C01B 31/00
[52] U.S. Cl. ............................... 423/445 B; 204/157.41; 204/157.47
[58] Field of Search ........................... 423/445 B, 445 R; 204/157.41, 157.47

[56] References Cited

U.S. PATENT DOCUMENTS

| | | | |
|---|---|---|---|
| 5,171,373 | 12/1992 | Hebard et al. | 136/252 |
| 5,215,841 | 6/1993 | Scharfe et al. | 430/59 |
| 5,278,239 | 1/1994 | Hoxmeier | 525/232 |
| 5,367,051 | 11/1994 | Narang et al. | 528/424 |
| 5,453,413 | 9/1995 | Eklund et al. | 502/416 |
| 5,462,680 | 10/1995 | Brois et al. | 252/9 |
| 5,523,438 | 6/1996 | Schlogl et al. | 556/136 |
| 5,558,903 | 9/1996 | Bhushan et al. | 427/11 |

FOREIGN PATENT DOCUMENTS

| | | |
|---|---|---|
| 7-33889 | 2/1995 | Japan . |
| 7-104330 | 4/1995 | Japan . |
| 7-134413 | 5/1995 | Japan . |

OTHER PUBLICATIONS

Eletskii, A.V., "Diffusion Separation of Fullerenes in Solution", in Science and Technology of Fullerene Materials, Materials Research Society Symposium proceedings, vol. 359, published 1995, pp. 567–572.

*Primary Examiner*—Gary P. Straub
*Assistant Examiner*—Peter DiMauro
*Attorney, Agent, or Firm*—Nikaido Marmelstein Murray & Oram, LLP.

[57] ABSTRACT

Fullerene compounds such as C60 are dissolved into solvents such as toluene in concentration of 1×10–3 mol/L or more. When the solution is coagulated, fullerene associated bodies are formed. After the re-dissolution of the solution, the associated bodies are excited by laser beam, and the resultant is cluster compounds of fullerene having specific number of monomers, such as 23 and 53. The cluster is stable and separable from the solution.

6 Claims, 17 Drawing Sheets

ABSORPTION
(arb. units)

INTENSITY
(arb. units)

INTENSITY
(arb. units)

INTENSITY
(arb. units)

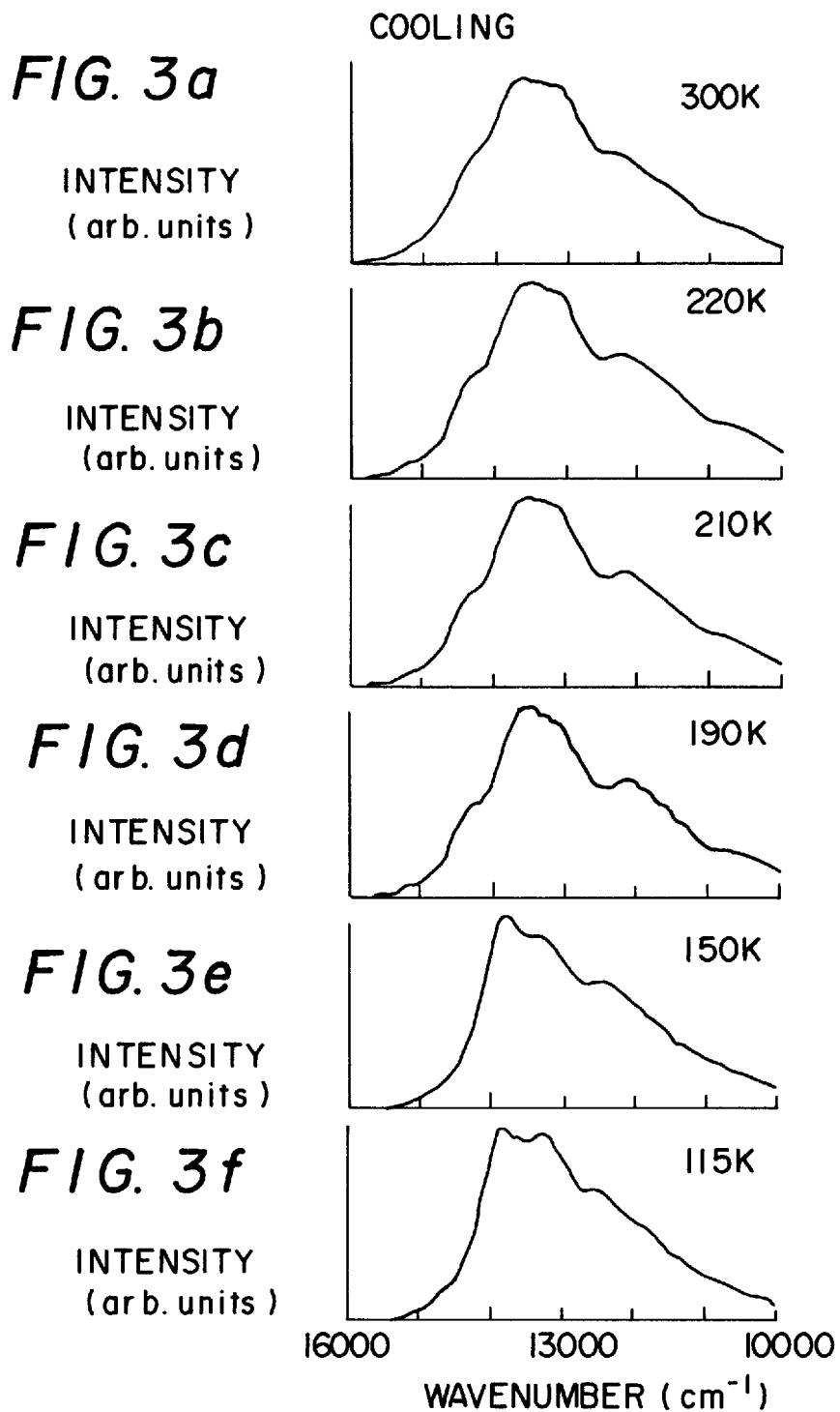

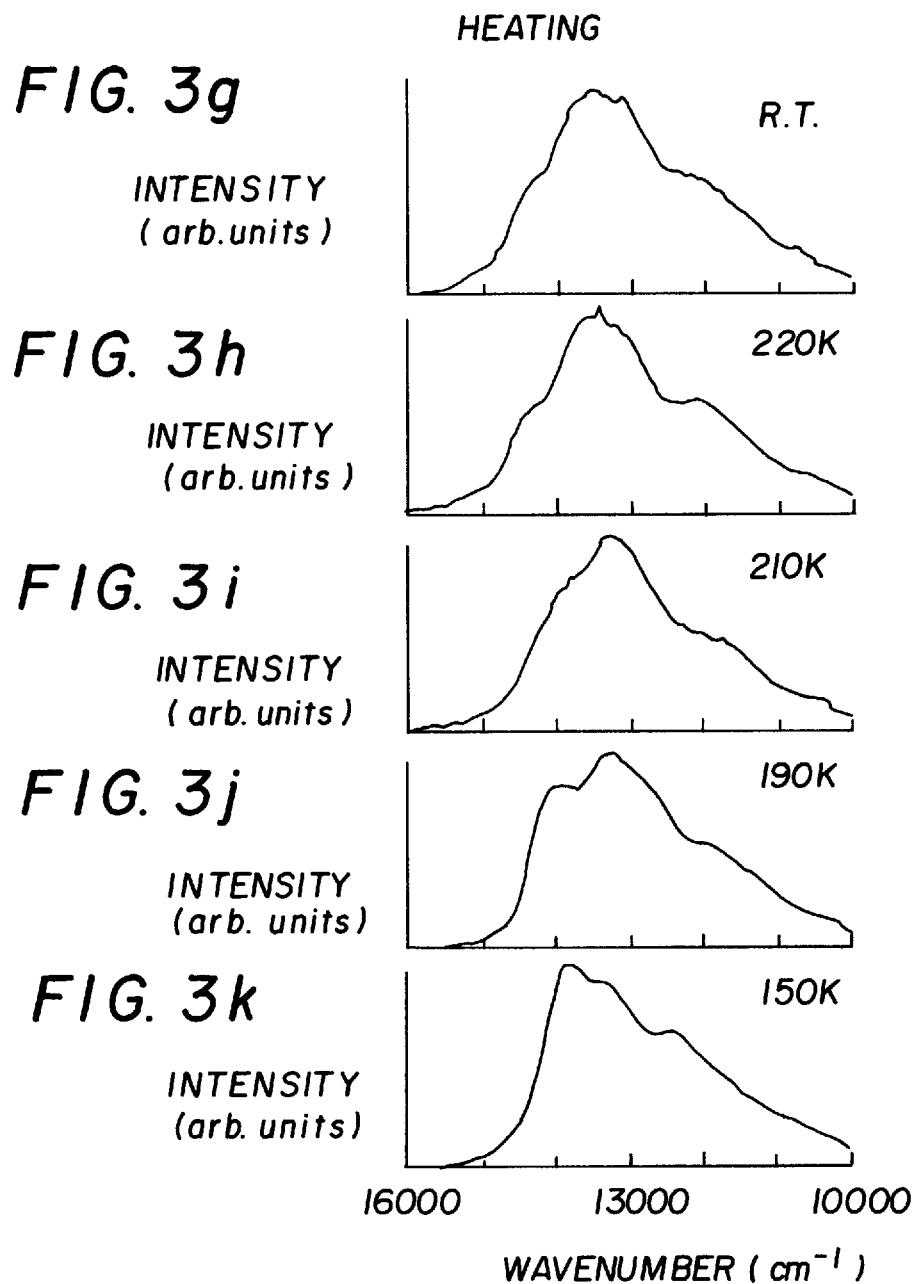

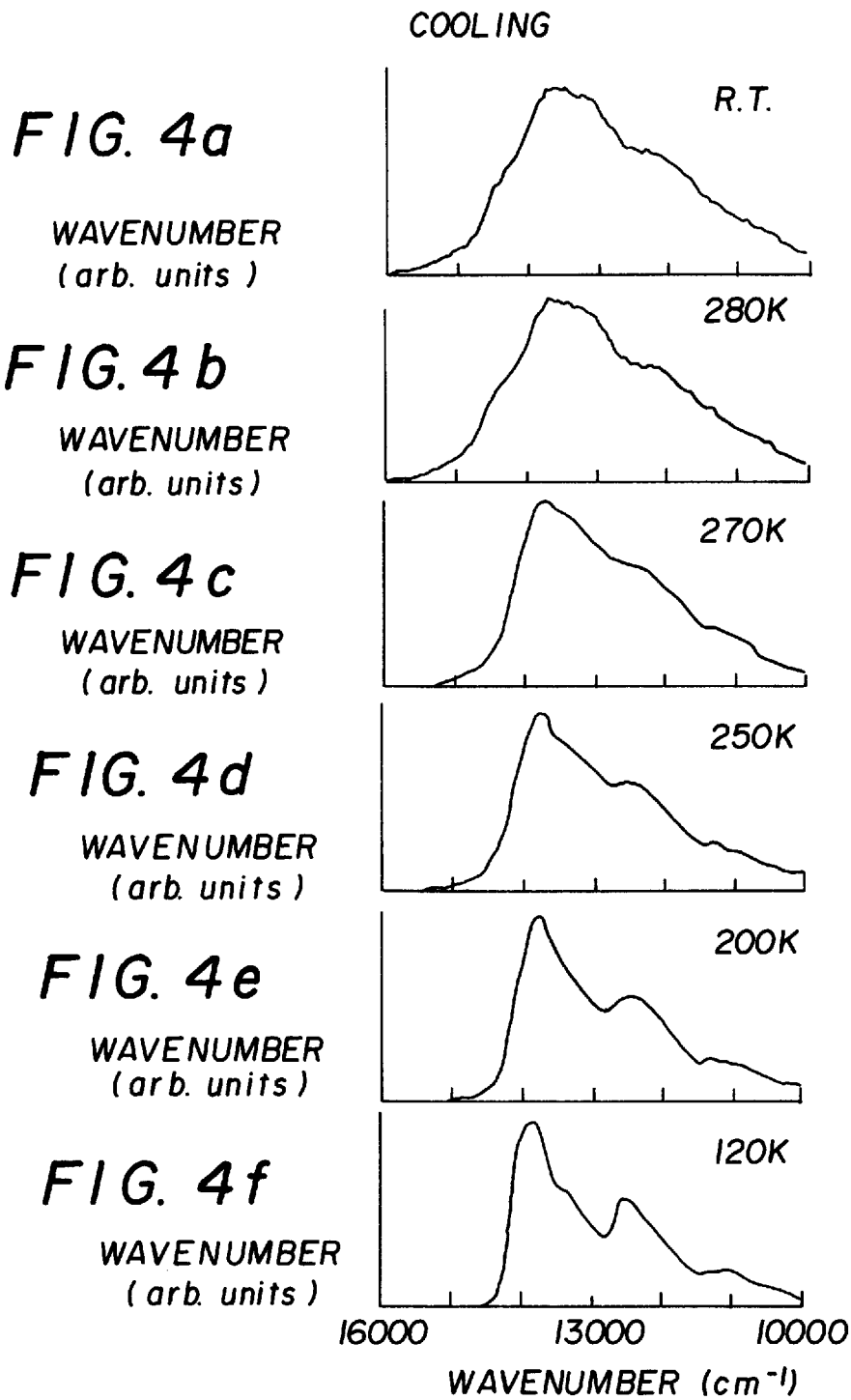

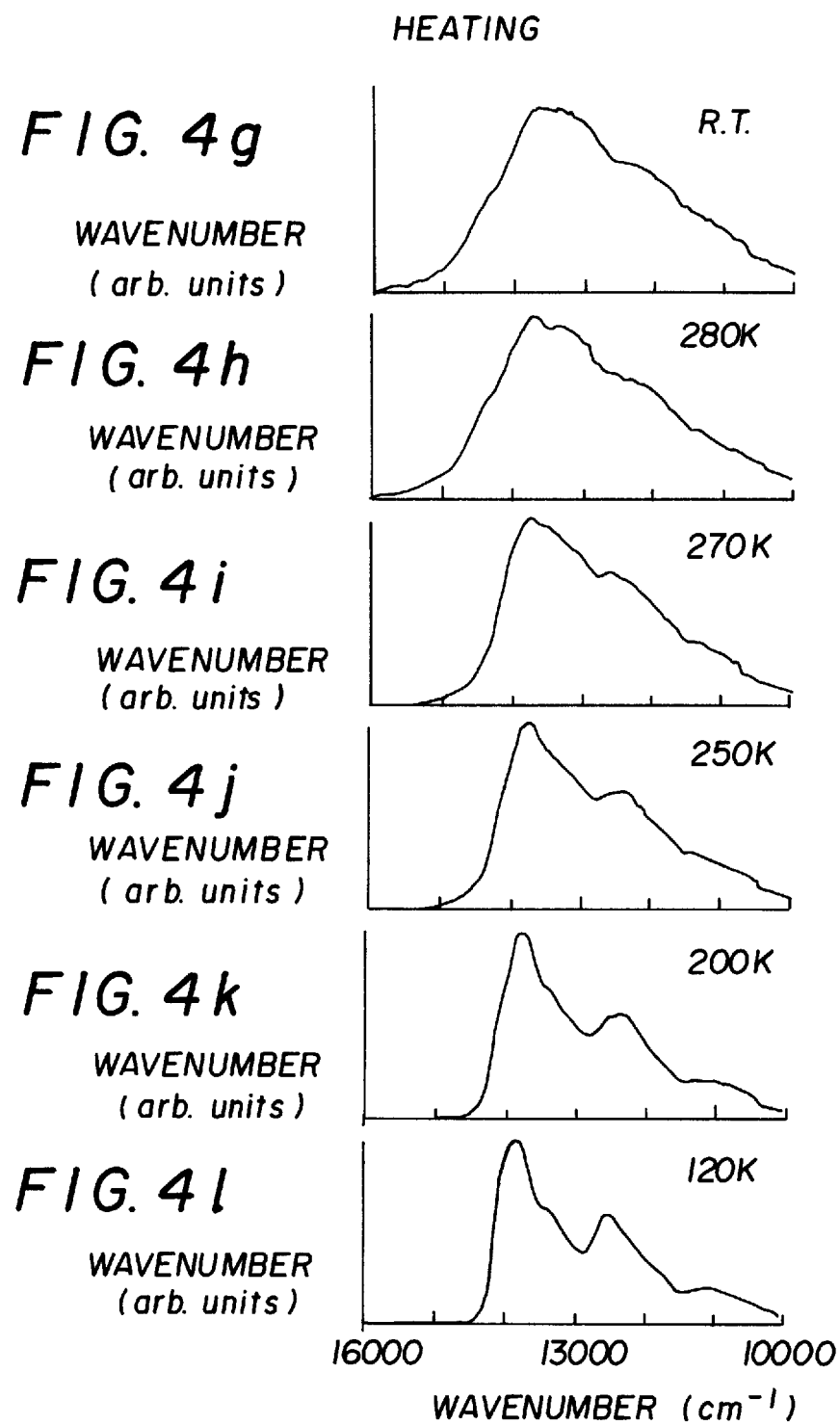

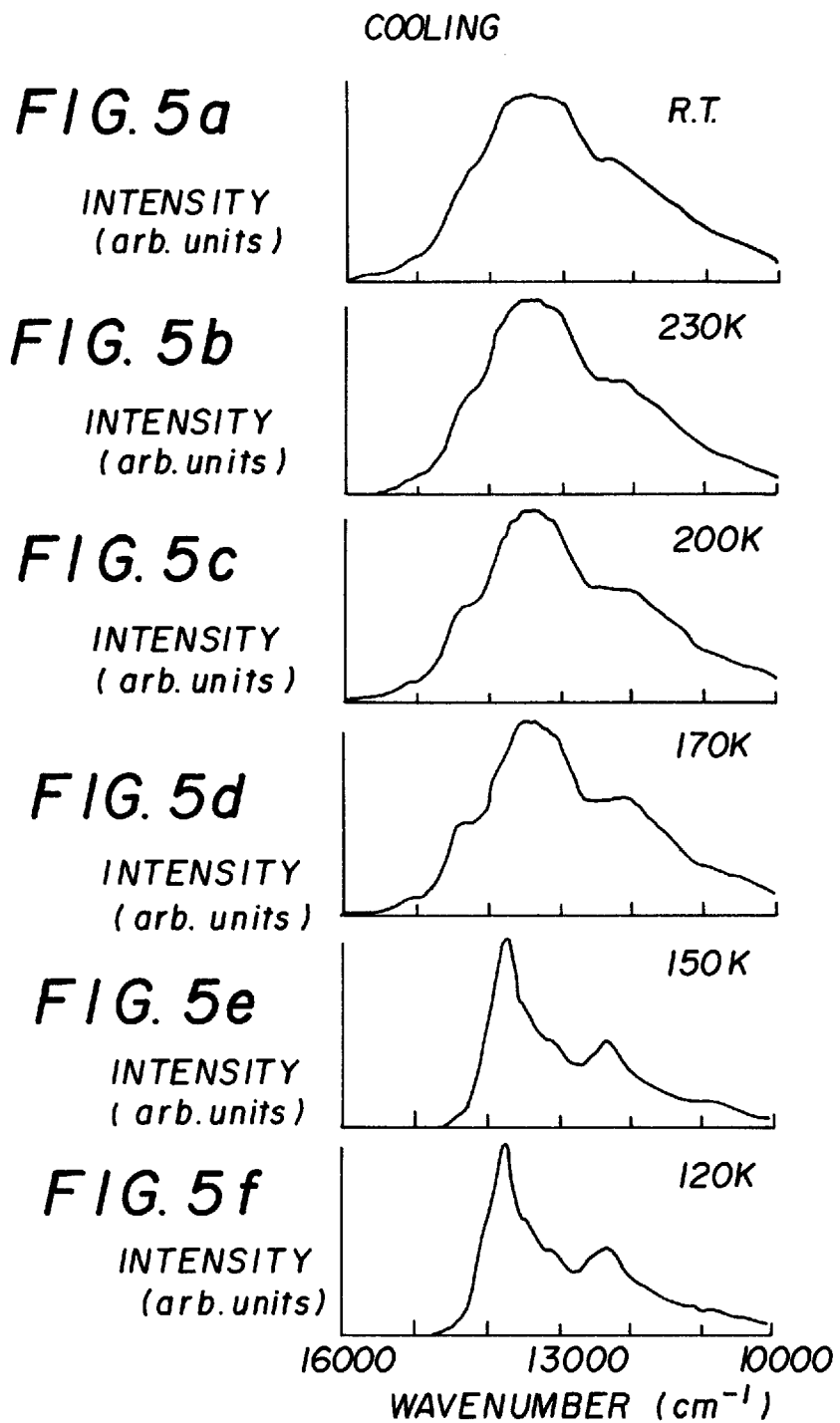

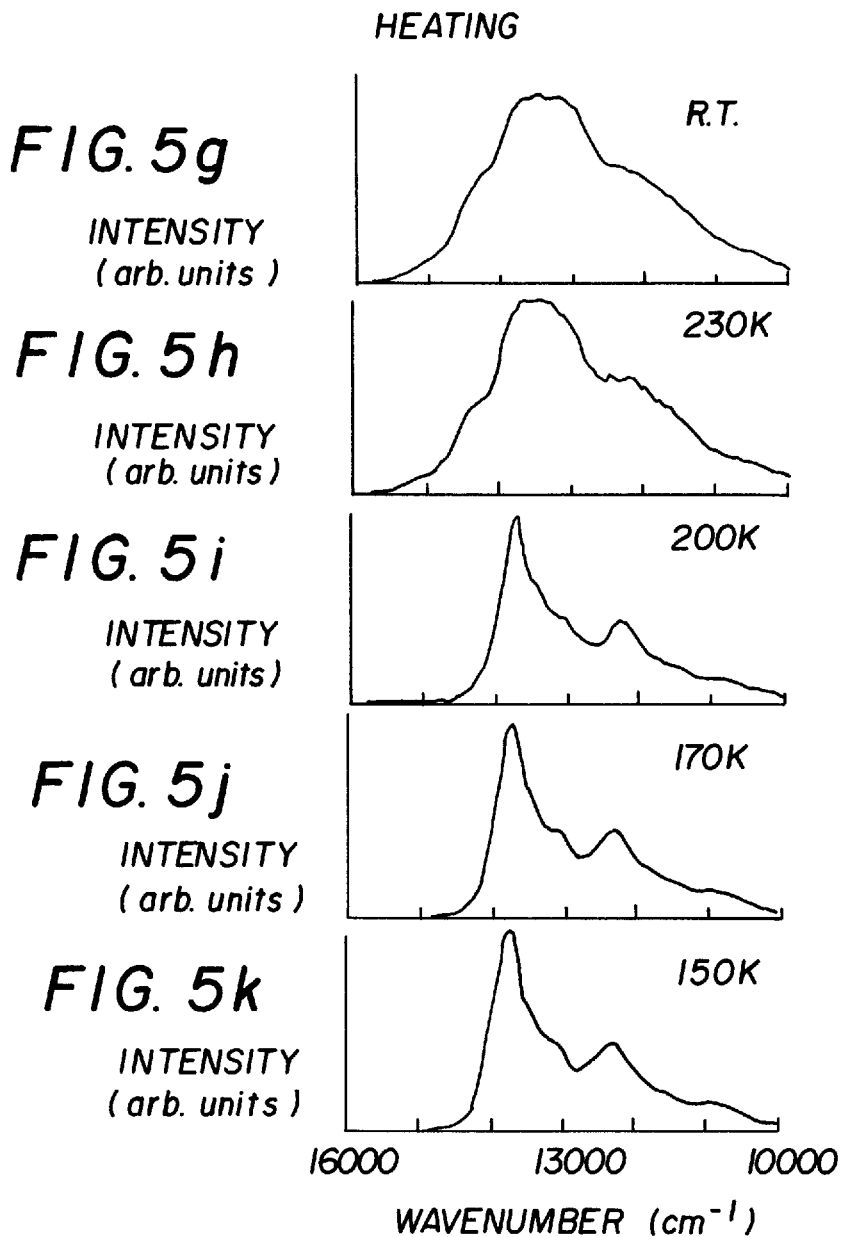

FULLERENE COMPOUND, MANUFACTURING METHOD, AND USE

FIELD OF THE INVENTION

The present invention relates to a new cluster compound and an associated body of fullerene, such as C60. The present invention, in particular, relates to manufacturing of the associated body by the coagulation of fullerene monomer solutions and also to manufacturing of the fullerene cluster compound by the photo-excitation of the associated body in the solutions. Furthermore, the present invention relates to lithography with the use of the associated body and the cluster compound of fullerene.

PRIOR ART

Fullerenes are compounds which comprise only carbon atoms, having an intermediate structure between those of graphite and diamond, and have six-membered rings and five-membered rings of carbon atoms. Some fullerenes have a substitutional element in place of carbon atom or an additional element. Furthermore, some fullerenes have a metal atom included in their ball-like molecules, and other have an oxygen or metal atom between fullerene molecules. In this specification, the term of fullerene means, in a narrow sense, fullerene compounds consisting of their carbon framework only and, in a broad sense, includes their derivatives.

A typical fullerene compound is C60, and other fullerene compounds include C76, C78, C82, C84, C240, C540, and C720. They have ball-like molecular shapes, while some have tubular molecular shapes which are less important; therefore, ball-like fullerene compounds will be mainly described.

Fullerenes exist in solutions and also as single crystals. Suitable solvents include benzene, toluene, CS2, acetone, trichloro-ethylene, and chloro-benzene. Fullerene molecules in single crystals and also in solutions rotate freely. Fullerene molecules, namely fullerene monomers, even in a single crystal thermally rotate at room temperature, while they have no freedom for translation. This is because fullerene molecules are ball-like in shape with little anisotropy, and therefore, intermolecular connection is weak and its potential is isotropic. The intermolecular bonding depends mainly upon van der Waals force based upon $\pi$ electron interaction.

Lithography is a potential application of fullerenes. Fullerenes sublime into thin films. If latent images formed in such thin films may be developed, then lithography is possible. With respect to this, The Atom Technology Research Group of Japanese Industrial Technology Institute presented that latent images with the resolution of 20–30 nm were formed on fullerene thin films by electron beam impact and that un-exposed fullerene was removed by mono-chlorobenzene (Daily Industry, Mar. 12th, 1996). The product by the electron impact was assumed to be graphite, and the ball-like structure of fullerene molecules was assumed to be destroyed by the impact.

Japanese Provisional Patent Hei 7-134413 discloses to expose C60 thin films in oxygen atmosphere to an ultra-violet beam of the wavelength of 350–405 nm so as to convert the films to resist films. Unexposed fullerene remaining as the monomer is removed by ion etching; etchant is, for example, CF4. Oxygen atoms are adsorbed on the surface of C60, and excitation by the ultra-violet beam brings the reaction between fullerene molecules in the presence of oxygen. The structure of the product is unclear on whether it is graphite-like or fullerene-like. However, without the adsorbed oxygen, ultra-violet beam in this wave length does not bring the reaction between fullerene molecules.

SUMMARY OF THE INVENTION

The object of the invention is to produce a new fullerene cluster compound wherein fullerene molecules, namely, fullerene monomers, are chemically bonded through a force stronger than van der Waals force with each other and where the degree of freedom for molecular rotation is lost.

Another object of the invention is to produce an associated body of fullerene, which is the starting material of the cluster compound. In the associated body, fullerene molecules are mutually bonded through van der Waals force.

Still another object of the invention is to provide a lithography method with the use of the associated body and the cluster.

In the fullerene cluster compound of the present invention, the monomer molecules are mutually bonded so that the degree of freedom for rotation is lost. Of course, the degree of freedom for translation is lost in the cluster compound or in the associated body. Fullerene cluster compounds thus produce contain generally a specific number of monomers, for example, when the monomer is C60, the degree of clusterization, namely the number of monomers contained in a cluster particle, is 12–14, 22–25, 50–55, and in particular 13, 23–24, and 52–53.

The fullerene cluster compound of the present invention is produced by first forming the associated body of fullerene monomers by solidifying a fullerene monomer solution and then by bonding the monomers in the associated body mutually by photo-excitation, such as laser beam irradiation. The associated body of fullerene is the intermediate for the production of the cluster compound and may be produced by adding a poor solvent into monomer solutions. An preferable example of poor solvents is alcohol compounds, poor solvents should have little or no solubility of fullerene and at least should have less solubility of fullerene than the solvent used in the initial solution. When a poor solvent is added, the associated body of fullerene is produced without coagulation of solutions. These claims are product by process claims which specify the resultant cluster compound by the above production methods.

The fullerene cluster compound of the invention is produced by the coagulation of a fullerene monomer solution or by the addition of a poor solvent into the monomer solution so that the associated body is produced and then by photo-excitation of the associated body in the solution so that the monomers in the associated body are mutually chemically-bonded.

The intermediate product for the fullerene cluster compound is the associated body of fullerene. Fullerene molecules, for example, of several to several hundreds, more particularly, of several to several tens, are associated in the solution and form the associated body. The associated body is easily produced by the coagulation of monomer solutions or by the addition of a poor solvent into monomer solutions. Solvents of the monomer solutions are preferably toluene, benzene or CS2, and other solvents which have the solubility of fullerene are also usable. Moreover, there is a concentration dependence in the formation of the fullerene associated body. It is preferable that monomer concentrations in the solutions are at least $1\times10^{-3}$ mol/L.

Fullerene monomer concentrations in the solutions are preferably $2.5\times10^{-3}$ mol/L or more in toluene solutions, $1.5 \times 10^{-3}$ mol/L or more in benzene solutions, and $1.5 \times 10^{-3}$ mol/L or more in CS2 solutions. Then, substantially all fullerene monomers are converted to the associated body by the coagulation of the solutions or by the addition of a poor solvent. The associated body once formed is generally stable to some temperature higher than the melting points of the solutions, when re-heated, except for solutions having relatively high melting points, such as benzene solutions. Therefore, the cluster compound may be generated in the coagulated solutions or in re-dissolved solutions. In this specification, the re-dissolution of solutions of fullerene associated body means to dissolve the solutions at a temperature by which the associated body does not decompose, unless otherwise specified.

In the conversion of the associated body to the cluster, solutions of the associated body may be condensed, for example, by applying the solution on a substrate and evaporating the solvent partly, before producing the cluster.

The present invention is also in a fullerene associated body produced by the addition of a poor solvent into a solution of fullerene monomer.

The present invention is also in a manufacturing method of a film of fullerene cluster compound comprising a step for forming a film of a fullerene associated body solution on a substrate, and a step for converting the associated body in the solution into the cluster film adhered on the substrate by the irradiation of light on the solution. The associated body may be prepared before the formation of the solution film or prepared after the formation of the solution film by the coagulation of the film formed. Preferably, the light irradiation is performed locally so that a latent image is formed in the film of fullerene cluster compound. The associated body which remains after the formation of the latent image may be removed by washing with a solvent of the fullerene, by sublimation of fullerene monomer, and by ion irradiation, etc. Thus the latent image is developed.

The inventors have found that when a fullerene compound such as C60 was dissolved in a solvent, such as benzene, toluene, and CS2, and when the resultant solution was coagulated, fullerene in the solution associated. Furthermore, the association occurred by adding a poor solvent of the fullerene to the solution. The formation of the associated body was confirmed by the color change of the solution, for example. Moreover, the coagulation made a change in the spectrum of the solution, for example, the fluorescence spectrum according to Ar ion laser irradiation (514.5 nm). This supports the formation of the associated body. The associated body once formed is stable in most cases to some temperature after the re-dissolution of the solution, and the characteristics of the spectrum of the coagulated solution are kept up to the temperature after the re-dissolution. This applies to solvents having relatively low melting points, such as toluene and CS2, and in a solvent of a relatively high melting point, such as benzene, the associated body decomposed with re-dissolution. Thus, generally there is hysteresis in the spectrum of the solution between cooling and heating, and the spectrum of the solution when re-dissolved is similar to the spectrum of the coagulated solution till the decomposition of the associated body. The hysteresis in the spectrum strongly supports the formation of the associated body.

Solvents for the solution is not limited to benzene, toluene, and CS2 and is one which has the solubility of fullerene. The species of fullerene are not limited to C60, and ball-like fullerene, such as C70, C76, C78, C82, C84, C240, C540, and C720 and tube-like fullerene, such as C500 are acceptable; however ball-like fullerene is particularly important. Fullerene compounds which consist of their carbon frame work without a substitutional group, an additional element, or an additional element adsorbed in the surface of fullerene molecule or included in the carbon frame work is preferable; however fullerene derivatives having such substitutional groups and so on, may be usable.

There is a concentration dependence in the formation of the associated body, and the formation of the associated body proceeds with the concentration of $1 \times 10^{-3}$ mol/L or more. In this specification, "concentration" means one converted into monomer density, unless otherwise specified. In particular, there is a threshold value for the monomer concentration. If the concentration is not less than it, only the associated body is present in coagulated solutions, and substantially all the monomers are converted to the associated body. The threshold is $2.5 \times 10^{-3}$ mol/L for toluene, $1.5 \times 10^{-3}$ mol/L for benzene, and $1.5 \times 10^{-3}$ mol/L for CS2.

The spectrum of the solution, namely one to be attributed to fullerene, changes with of the formation of the associated body. With the assumption that the shift of the peak position in the spectrum is attributable to the change in the confinement effect of excitons formed b laser irradiation, the size of the associated body in toluene solvent is estimated about three molecule long in the diameter of the associated body. Namely, with the formation of the associated body, the exciton is delocalized in the associated body, and the wave number of the fluorescence decreases. The diameter of the associated body is estimated about three molecule long in benzene solutions and about five molecule long in CS2 solutions.

Presently the associated body is detected only in solutions and while it is possible to concentrate the solutions, the associated body has not been separated from the solutions.

Now, let us consider the formation mechanism of the associated body. The solubility of fullerene decreases when a solution is coagulated, and therefore, fullerene molecules in the solution have a tendency to deposit. Similarly, when a poor solvent of fullerene is added to the solution, fullerene molecules have the same tendency to deposit. This is a kind of pressure which makes fullerene deposit out of the solvent. Next, van der Waals force between fullerene molecules makes fullerene associated. The formation of the associated body is attributable to van der Waals force between fullerene molecules and the pressure from the solvent to make fullerene deposit out of the solvent.

Peculiarly, there is a specific degree of association in the associated body, and the growth of the associated body does not proceed any more. For example, the size of the associated body in toluene solutions is about three molecule long in the diameter, and after the conversion to cluster from the associated body, the degree of clusterization was observed at about 13, 23, and 53 by laser mass spectroscopy. The laser mass spectrum observed was discrete, and particles of intermediate mass was hardly observed. This means the associated body, starting material of the cluster compound, has a specific degree of association, while the degree of association changes depending on the kind of solvents.

The fact that the associated body has a specific degree of association suggests that the associated body has some structure which stabilizes the associated body and prevents it from further growth. While usual precipitation becomes more stable with its growth, the associated body becomes most stable at a certain degree of association. One factor contributing to the specific degree of association is a steric one which affords a close structure to the associated body.

Another factor is probably in the solvent. The associated body is a kind of pore in the solvent, and stability of the solvent in the interface with the pore depends on the shape and the size of the pore; for example, a structure of the pore which does not disorder the arrangement of coagulated solvent molecules is stable. However, it is unclear whether the solvent molecule is present in the associated body, in particular, in the inter-molecular space between fullerene molecules.

The associated body is the starting material of the fullerene cluster compound. When the solution of the associated body is excited for example, by YAG laser irradiation (three time wave, 355 nm), the associated body is converted into the cluster. While electron impact is acceptable for the excitation, electron impact under the existence of the solvent vapor is difficult. For the electron impact, irradiation at an extremely low temperature is necessary for reducing the vapor pressure of the solvent. On the contrary, laser irradiation may be performed in the presence of solvent vapor and does not decompose fullerene into graphite. Moreover, the efficiency of cluster formation depends only slightly upon the wave length of irradiation light, and therefore, the wave length is arbitrarily in the range of the absorption band of the associated body. For example, a focused ultraviolet lamp may be used as a simple excitation light source.

The excitation should be done to the solution of the associated body which may be solid or re-dissolved. When a substrate is soaked in an associated body solution and for example, when laser is irradiated, a part of the cluster becomes supernatant and adheres to the substrate. Some of the cluster grows up and are precipitated. The ratio of the supernatant and the precipitation depends on the pulse width of the laser, and the ratio of the supernatant increases, when the pulse width is decreased. This suggests that the cluster formation is not a chain reaction. When a laser beam is irradiated to an associated body solution coagulated, the growth of the cluster size is relatively slow, and cluster of relatively small molecular weight is obtained. Cluster adhering to the substrate does not flake off and may be used as a resist. The precipitation may be used, for example, as a solid lubricant, a micro-bearing, and a super-conductor material.

The mass distribution of the cluster was found discrete by laser mass spectroscopy, which is well known. For example, the cluster of C60 produced from a toluene solution had peaks of mass distribution at about 13, 23, and 53 pieces, each converted to C60, and there were little intermediate mass distribution. This shows that the cluster has some structure not in a random structure as graphite is and that the cluster has a huge molecular structure where the original carbon framework of fullerene is maintained. Furthermore, the fact that specific numbers of fullerene molecules are contained in the cluster shows the cluster has a steric structure into which fullerene molecules are combined. Moreover, since the cluster is separable from solutions, the cluster is a stable material where each fullerene molecule can not thermally rotate and each molecule are chemically bonded.

According to the invention, a fullerene cluster compound consisting of carbon atoms without additional elements such as oxygen, while not limited to them, is produced. The resultant fullerene cluster compound consists of, for example, a fullerene net work which is different from mere fullerene molecules.

Resultant fullerene cluster compounds may be used for lithography, and so on. For example, an associated body solution of fullerene, preferably after re-dissolution, is applied on a substrate by spin-coat method, etc. Thus, a film of associated body solution is formed and is converted to cluster by photo-excitation, etc. The cluster formed adheres onto the substrate as a resist. The remaining associated body and monomer are removed by washing with a solvent, or may be converted to monomer by heating. Remaining associate body may be removed by the sublimation of monomer in a subsequent step.

Assuming the degree of clusterization in the cluster from 20 to 50, the diameter of C60 cluster is about several nm, and the resolution in lithography is, for example, 10–100 nm. This resolution is suitable for lithography in sub-micron area, and therefore, the invention is suitable for patterning in sub-micron area.

BRIEF DESCRIPTION OF THE DRAWINGS

FIG. 2($a$) shows the fluorescence spectrum in the concentration of 7×10–4 mol/L; FIG. 2($b$) in the concentration of 2.2×10–3 mol/L; FIG. 2($c$) in the concentration of 2.5×10–3 mol/L; and FIG. 2($d$) shows the fluorescence spectrum of a C60 single crystal. Dotted lines in the figure show spectra at 300 K and solid lines show spectra at 120 K.

FIG. 3 is a characteristic diagram showing the temperature dependence of the fluorescence spectrum of a toluene solution of C60 in the concentration of 2.3×10–3 mol/L.

FIG. 4 is a characteristic diagram showing the temperature dependence of the fluorescence spectrum of a benzene solution of C60 in the concentration of 2.0×10–3 mol/L.

FIG. 5 is a characteristic diagram showing the temperature dependence of the fluorescence spectrum of a CS2 solution of C60 in the concentration of 2.0×10–3 mol/L.

EMBODIMENT

Figure 1:
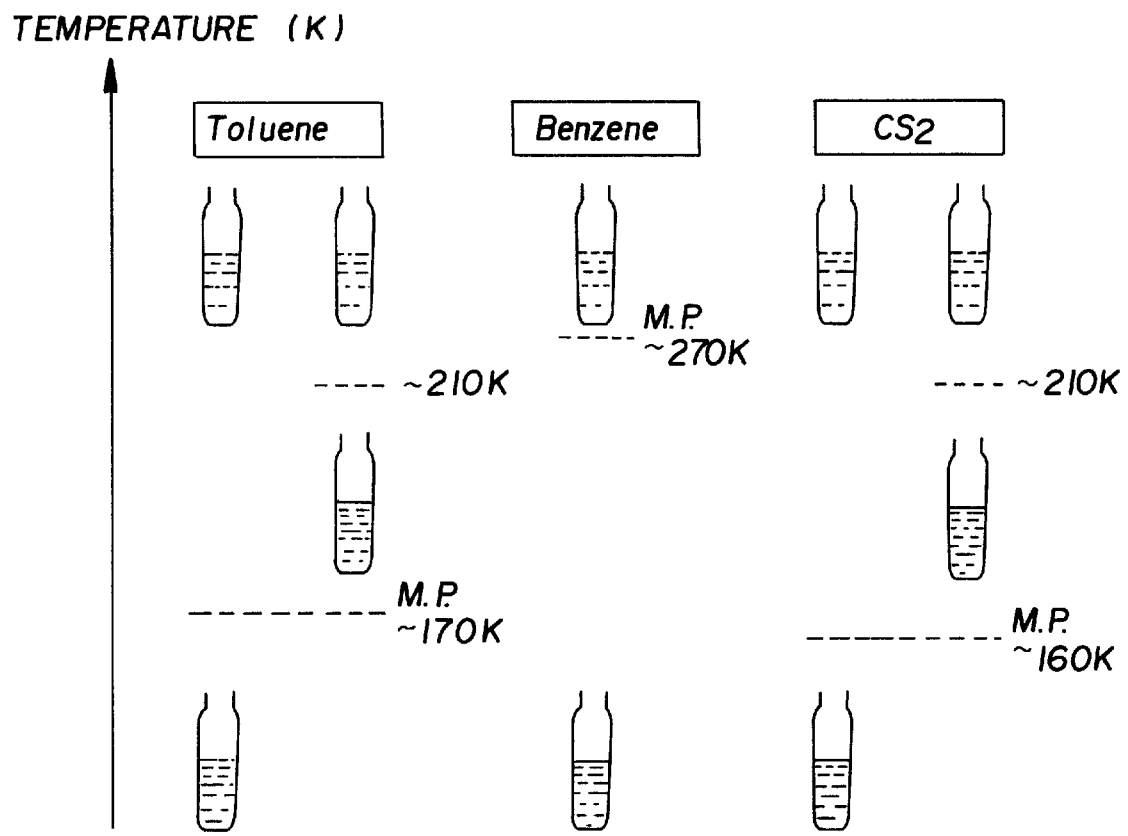
FIG. 1 shows a manufacturing method of a fullerene associated body and also shows its formation temperatures by coagulation and decomposition temperatures to the monomer.

A production method of fullerene associated bodies is schematically shown in FIG. 1, where toluene, benzene, and CS2 are used as solvents, while other solvents of fullerene are usable. While C60 was described throughout embodiments, other ball-like and tubular fullerene compounds are also usable. While not preferable, fullerene compounds having another element or a substitutional or an additional group are acceptable. C60 solutions have generally a color of light purple at room temperature, and the Lone of a degassed C60-toluene solution changed from light purple into yellow in the vicinity of the freezing point, when cooled gradually. The yellow tone kept constant till 210 K after the solution was re-dissolved, and above 210 K the tone changed into the original light purple.

Similar phenomena occurred in other solvents, for example, in C60-benzene solutions the tone changed from light-purple into yellow at the melting point of 270 K, and the tone was kept constant till the solution was dissolved again. Moreover, the color of C60-CS2 solutions changed from light purple into yellow when cooled below 160 K, the freezing point, and the color was kept yellow till 210 K when re-dissolved. These changes in the tone show a change in the state of fullerene, and the color change appeared only when gradually cooled. Therefore, preferable cooling rate near melting points is not greater than 1 K/minute.

Fluorescence spectra of C60-toluene solutions are shown in FIG. 2. In (a) of the figure the concentration is $2.2 \times 10^{-4}$ mol/L, in (b) of the FIG. $7 \times 10^{-4}$ mol/L, and in (c) $2.5 \times 10^{-3}$ mol/L. Moreover, FIG. 2(d) shows the fluorescence spectrum of a C60 single crystal as a reference.

Figure 2A:
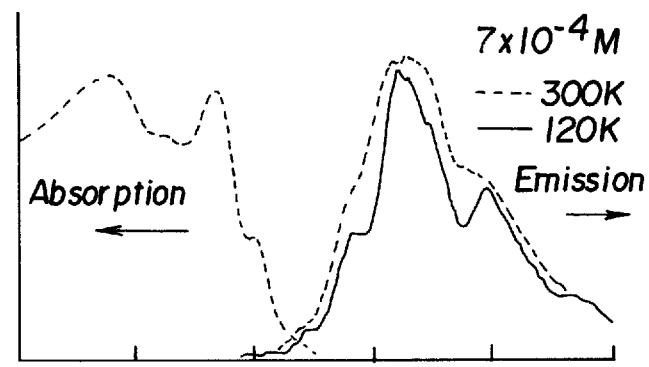
FIG. 2 is a characteristic diagram showing the fluorescence spectrum of C60 associated body in toluene solutions.

These fluorescence spectra were observed after excitation by Ar ion laser of 514.5 nm, whose output was limited so that the associated bodies would not react; dotted lines show spectra at 300 K, and solid lines show spectra at 120 K. As shown in FIG. 2(a), light of 514.5 nm (wave number of 19440 cm−1) is absorbed by C60; and therefore, fluorescence spectra are observed. The fluorescence spectrum of FIG. 2(a) at 120 K, where C60 concentration was $7 \times 10^{-4}$ mol/L, was essentially the same as one at 300 K, while band width at the lower temperature was narrower.

Figure 2B:
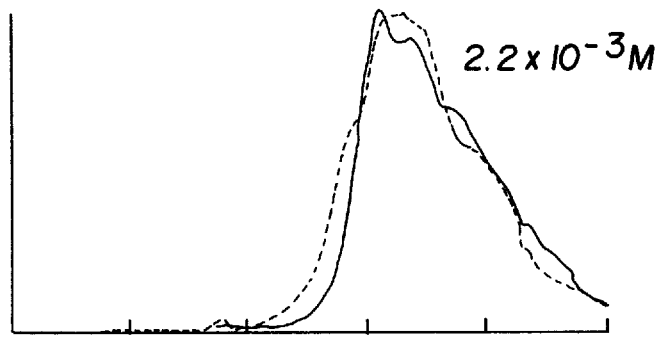

When concentration of C60 was increased to $2.2 \times 10^{-3}$ mol/L, as shown in FIG. 2(b), the spectrum at 120 K shifted to lower wave numbers from that at 300 K. In C60 concentration of $2.5 \times 10^{-3}$ mol/L, FIG. 2(c), changes in the spectrum was remarkable and the spectrum was similar to that of a single crystal of FIG. 2(d). In the low concentration spectrum of FIG. 2(a), a shoulder of the spectrum was present near 15000 cm−1, and in spectra of FIGS. 2(b) and (c) the shoulder was absent and moved to a peak near 14000 cm−1. This shows the shoulder near 15000 cm−1 shifted to the peak near 14000 cm−1.

FIGS. 1 and 2 show the formation of the associated body by the coagulation of toluene solutions of C60. The changes in the tone and also in the fluorescence spectrum show the formation of the associated body, and the wave number shift in the spectrum shows the stabilization of exciton by the formation of the associated body. Further, the spectrum of FIG. 2(c) is similar to that of a single crystal, FIG. 2(d), and shows that fullerene monomer hardly exists in the coagulated solution. FIG. 2 shows that the association is concentration dependent; in a concentration below $7 \times 10^{-4}$ mol/L no association occurs, and in a concentration not less than $2.2 \times 10^{-3}$ mol/L the association occurs. Similar spectra were observed in other solvents, such as benzene and CS2, and generally, the association occurred in concentrations not less than $1 \times 10^{-3}$ mol/L.

Figure 2C:
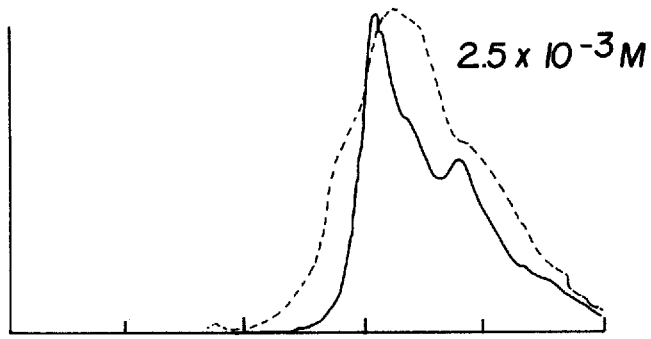
Figure 2D:
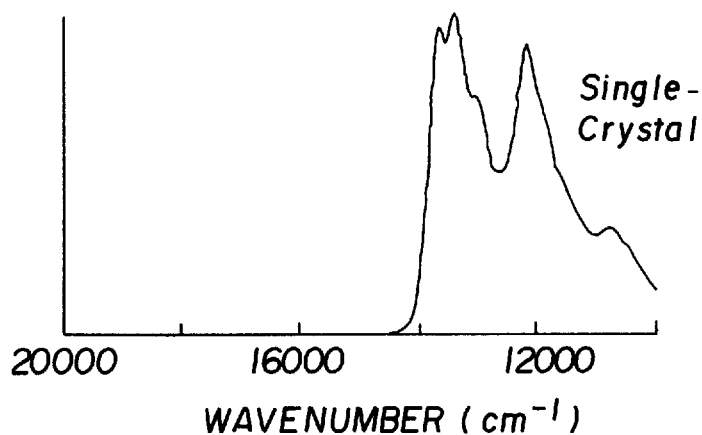

Moreover, as shown in FIG. 2(c), there is a threshold value of C60 concentration; if the concentration is equal to or above the value, substantially all monomer in solutions are converted to the associated body. This concentration is $2.5 \times 10^{-3}$ mol/L for toluene solutions, $1.5 \times 10^{-3}$ mol/L for benzene solutions, and $1.5 \times 10^{-3}$ mol/L for CS2 solutions.

FIG. 3 shows the temperature dependence of the fluorescence spectrum in a toluene solution of C60 ($2.3 \times 10^{-3}$ mol/L). In the left side of the figure, characteristics with cooling are shown, and in the right side characteristics with re-heating after coagulation are shown, both with measuring temperatures. The fluorescence spectra at 220 K of both cooling and re-heating are essentially similar to each other, and this shows that C60 associated body formed by coagulation decomposed into monomer. On the contrary, there was hysteresis in the spectra at 210 K and 190 K between cooling and heating, and this shows that the C60 associated body formed by coagulation was stable to about 210 K. As already shown, the fluorescence spectrum shifted to lower wave numbers, and the shoulder of the fluorescence spectrum near 15000 cm−1 shifted to the peak near 14000 cm−1 with the formation of the associated body. Further, the contribution of the monomer spectrum became smaller with cooling, and the contribution of the associated body spectrum increased.

In other solvents, phenomena similar to those of FIGS. 2 and 3 were observed; FIG. 4 shows the temperature dependence of the fluorescence spectrum of a benzene solution of C60 ($2.0 \times 10^{-3}$ mol/L). The characteristics in the left are those with cooling, and the characteristics in the right are those with re-heating. The freezing point of benzene is about 270 K, and benzene solutions become glassy below the freezing point. The fluorescence spectra changed between 280 K and 270 K. The spectrum at 280 K is attributable to monomer and is similar to one at room temperature. The spectrum at 270 K is attributable to the associated body. The contribution of the associated body to the whole spectra increases with the decrease in the temperature, and most is the spectrum of the associated body at 120 K. Moreover, the shoulder of spectrum in the vicinity of 15000 cm−1 attributable to C60 monomer shifts to the vicinity of 14000 cm−1 with the formation of associated body.

FIG. 5 shows the temperature dependence of the fluorescence spectrum of CS2 solution of C60 ($2.0 \times 10^{-3}$ mol/L). Measurement temperatures are shown in the figure, left side shows the characteristics with cooling, and the right side shows the characteristics with re-heating. Hysteresis between the spectra of heating and cooling is remarkable in the CS2 solution. Below 200 K, the associated body was present in the solution, and the energy shift according to the conversion from monomer to associated body is larger than those of the toluene solution and the benzene solution. Moreover, the characteristics of the fluorescence spectra at 120 K and 150 K were kept up to about 200 K, and the associated body generated was stable till about 200 K.

Formation mechanism of the associated body is considered. When solutions of fullerene are coagulated, the arrangement of solvent molecules becomes regular with a tendency to deposit the solute. When a poor solvent of fullerene is added to the solution, fullerene is made to deposit. These are forces to deposit and associate C60 molecules out of the solvent. At the same time, van der Waals force makes fullerene molecules to associate. Therefore, pressure from the solvent when coagulated or when a poor solvent is added and van der Waals force make fullerene molecules associate.

Figure 6:
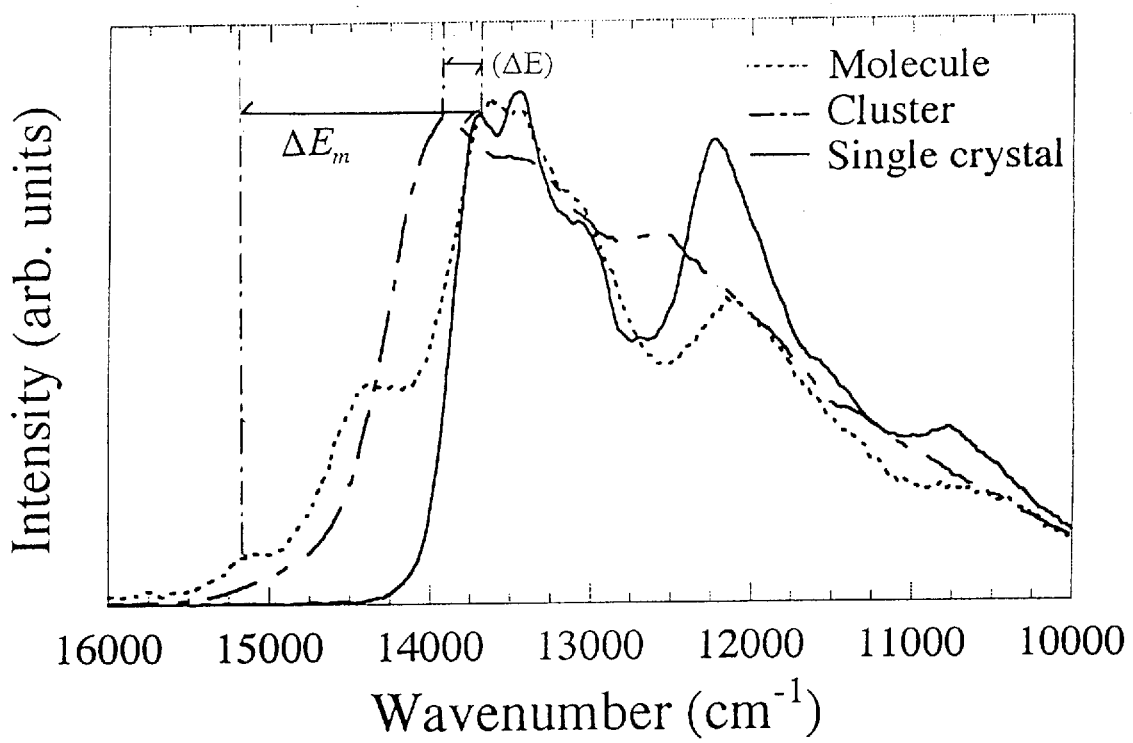
FIG. 6 is a characteristic diagram showing the fluorescence spectrum at 120 K of a C60-benzene solution (concentration of C60: 2.2×10–3 mol/L) and energy shifts ΔE by confinement effect of the exciton.
Figure 7A:
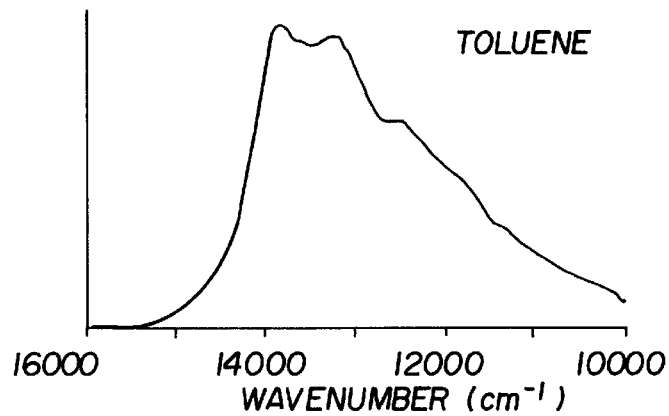
FIG. 7 shows fluorescence spectra at 120 K of toluene, benzene, and CS2 solutions of C60 (each 1.0×10–3 mol/L in concentration of C60) and the fluorescence spectrum of a C60 single crystals also at 120 K.
Figure 7B:
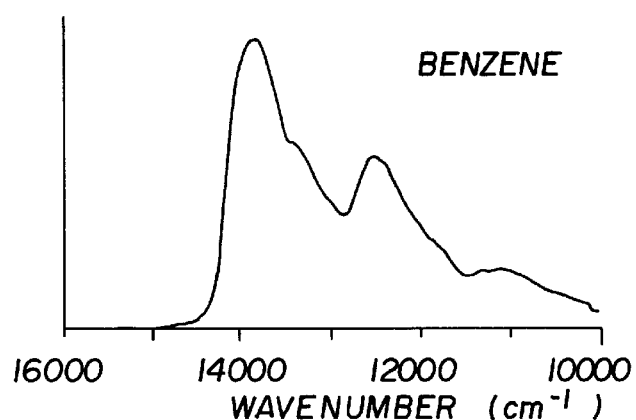
Figure 7C:
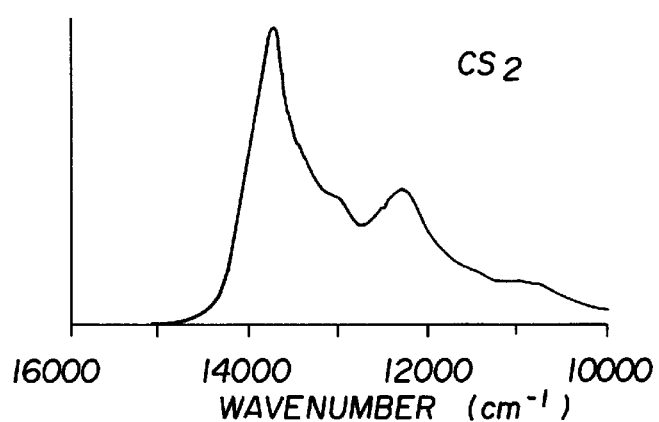
Figure 7D:
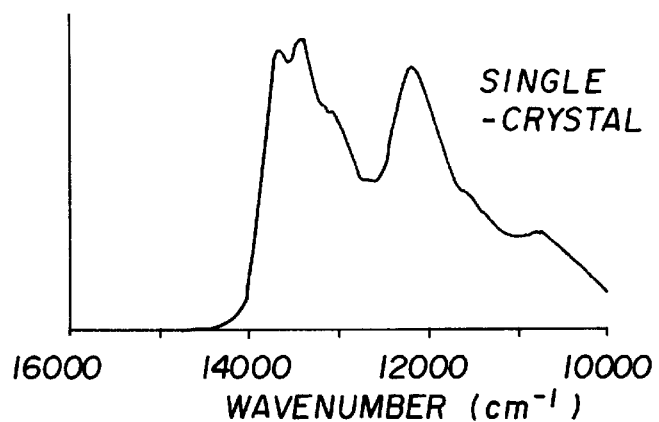

FIG. 6 shows the fluorescence spectrum of a C60 monomer-benzene solution ($2.2 \times 10^{-3}$ mol/L) and the spectrum of the associated body in the same concentration. The fluorescence spectrum of a single crystal is shown in the solid line as a reference. A shoulder at 15000 cm−1 or more of the monomer spectrum shifts to 14000 cm−1 or less in that of the associated body, and a corresponding peak in the single crystal is about 13800 cm−1. These spectra are attributable to excitons formed by the excitation with Ar ion laser, and energy shift shows the stabilization of excitons by delocalization. As is well known, energy shifts ΔE according to delocalization is inversely proportional to the second power of delocalization length of excitons. Now let us consider energy shift ΔE from the associated body to the single crystal and energy shift ΔE from C60 monomer to the single crystal. In the single crystal, excitons are completely delocalized; they can travel along an infinite length in the crystal. Therefore, the ratio of ΔE and ΔEm is in inverse proportion to the second power of the size of the associated body. Thus the size of the C60 associated body in benzene solutions is estimated about two nm in the diameter. This is an associated body where about three C60 molecules are arranged in the direction of the diameter.

FIG. 7 shows fluorescence spectra of toluene, benzene, and CS2 solutions at 120 K. Similarly, for the reference, the fluorescence spectrum of a single crystal is also shown. The concentration of C60 is 1.0×10−3 mol/L in each solution. The energy shift from the peak position in the fluorescence spectra is similar between toluene and benzene solutions and is large in the CS2 solution, and this shows the formation of larger associated body in CS2. The diameter size of the associated body, thus calculated, is about five molecules in the CS2 solution, about three molecules in benzene and toluene solutions. Other fullerene compounds than C60 are usable for the formation of the associated body, and other solvents than toluene, benzene, or CS2 are usable. Fullerene monomers do not react with each other when excited by ultra-violet ray. However, the associated body reacts with each other and forms the cluster by the excitation with ultra-violet ray. This reaction occurred in all solvents, including toluene, benzene, and CS2. Moreover, solvent temperature at photo-excitation is arbitrary, if the associated body is present, and therefore, it does not matter whether the solution is frozen or re-dissolved.

A pulse YAG laser (wave length 355 nm) was used to excite a toluene solution of C60 (concentration 1.0×10−3 mol/L) for changing the associated body to cluster. By the laser irradiation, supernatant of tea brown or black brown was caused in the solution. Simultaneously, precipitation of black brown was formed in the bottom of the vessel. The ratio of the supernatant and precipitation depended upon the pulse width of the YAG laser, and the ratio of precipitation increased with the increase of the pulse width. Thus, the cluster is formed by the laser irradiation, and when laser beam is further irradiated to the cluster already formed, mutual combination of clusterparticles proceeds with the growth of cluster size. Moreover the precipitation and the supernatant adhered onto the wall of the container forming a film, and the solvent may be removed to separate the cluster.

Figure 8:
FIG. 8 is an electron microscope photograph showing C60 cluster particles adhered onto a glass substrate at the magnification of 10,000 times.
Figure 9:
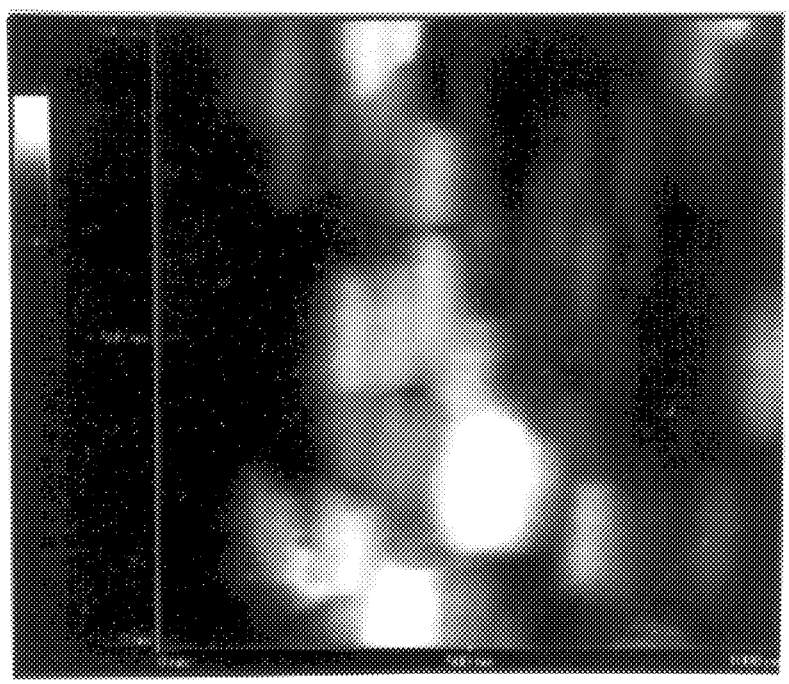
FIG. 9 is an interatomic force microscope photograph showing C60 cluster particle adhered onto the glass substrate.

FIG. 8 is an electron microscope photograph of 10,000 times of the cluster, when a glass substrate was soaked into a toluene solution of C60 associated body (concentration of 2.2×10−3 mol/L) and cluster was formed so as to deposit on the substrate. The cluster is ball-like and sticks on the glass substrate. FIG. 9 is an interatomic force microscope photograph of the cluster film on the same glass substrate, and the image shows a range of 1000 nm×1000 nm. Ball-like cluster particles pile up on the glass substrate.

These facts show that lithography is possible with the usage of the cluster. An associated body solution is applied onto a substrate to form a liquid film of the solution, and if necessary, the liquid film is concentrated by the vaporization of solvent under a reduced pressure. During these steps, the substrate was cooled to a temperature where the associated body is stable. Next, the associated body is converted into the cluster by laser irradiation, etc. The resultant clusters stick on the substrate as shown in FIGS. 8 and 9 and becomes a resist film. On the other hand, unchanged associated body and monomer may be easily removed with a solvent or the monomer may be sublimed by heating the substrate.

Figure 10:
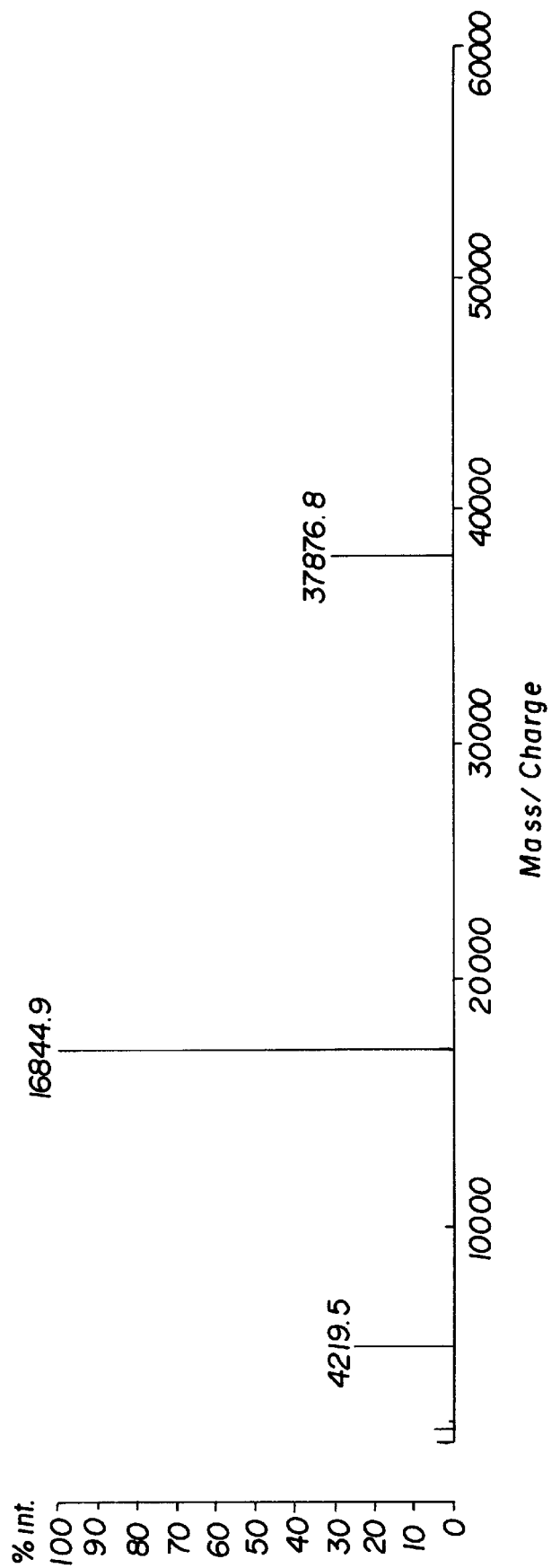
FIG. 10 shows a laser mass spectrum of a fullerene cluster prepared from a benzene solution.
Figure 11:
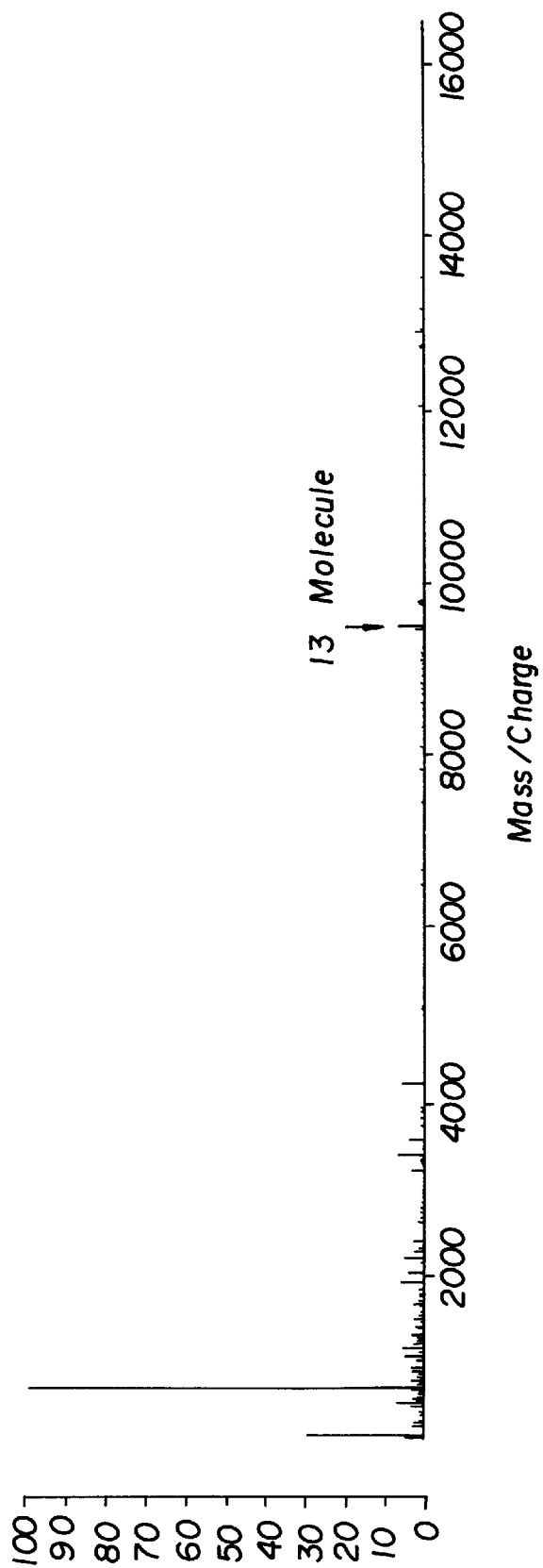
FIG. 11 shows a laser mass spectrum of a fullerene cluster prepared from a benzene-ethanol solution.

FIGS. 10 and 11 show the mass spectra of the cluster on a glass substrate prepared by a similar method to that of FIGS. 8 and 9. These spectra were observed by nitrogen laser mass spectroscopy; in FIG. 10, the intermediate associated body was prepared by the coagulation of a benzene solution of C60 (concentration of 2.0×10−3 mol/L), and in FIG. 11, the associated body was prepared by the addition of ethanol to benzene C60 solution of the same concentration at room temperature (Benzene 30 Vol %:ethanol 70 Vol %). The cluster was deposited on the substrate by the laser irradiation to the associated body.

As shown in FIG. 10, the mass distribution for the cluster using the coagulation of the benzene solution has three peaks of 4219.5 corresponding to the degree of clusterization of five to six, 16845 corresponding to degree of clusterization of 23–24, and 37877 corresponding to degree of clusterization of 52–53. As shown in FIG. 11, when ethanol was added to the benzene solution, there appears a new peak which corresponds to the degree of clusterization of 13 as well as the three peaks of degrees of clusterization of 5–6, 23–24, and 52–53. In FIG. 11, mass spectrum above mass number 16000 is omitted. Mass distribution between those peaks was negligible, and this shows that the mass distribution of the cluster is discrete, and therefore, the associated body, the starting material for the cluster compound, has also specific degrees of association.

It may be safely assumed that the peak with the degree of clusterization of five to six corresponds to most simple cluster or associated body, and most of the cluster has the degree of clusterization of about 12, about 23, and about 53. On the other hand, Martin, et al. have shown when C60 molecules are closely packed, the degree of association is advantageous in the vicinity of 13 and 23 and 55, since structures without pores are achieved, (Physical Review Letters Vol. 73 P. 3079, 1993) The peak with the degree of clusterization of 53 corresponds to 55 associated body of Martin, the peak of 23 corresponds to 23 associated body of Martin, and the peak of 13 corresponds to 13 associated body of Martin. This shows in the cluster C60 molecules are packed almost closely. The mass spectrum of the cluster has specific peaks without intermediate mass distribution; this fact suggests the original structure of fullerene molecule is maintained in the cluster. Therefore, in the cluster, closed surface of fullerene molecules are mutually bonded without the formation of graphite. The cluster exists out of a solvent and is stable. This fact shows that in the cluster each fullerene monomer is deprived of the freedom of rotation and fullerene molecules are chemically bonded with each other.

FIGS. 10 and 11 show the size of the cluster, and the size is several nm. This shows that resolution in lithography becomes about 10–100 nm and is suitable for patterning in sub-micron area.

Figure 12:
FIG. 12 is a transmission electron microscope photograph showing C60 cluster particles adhered onto a carbon net.
Figure 13:
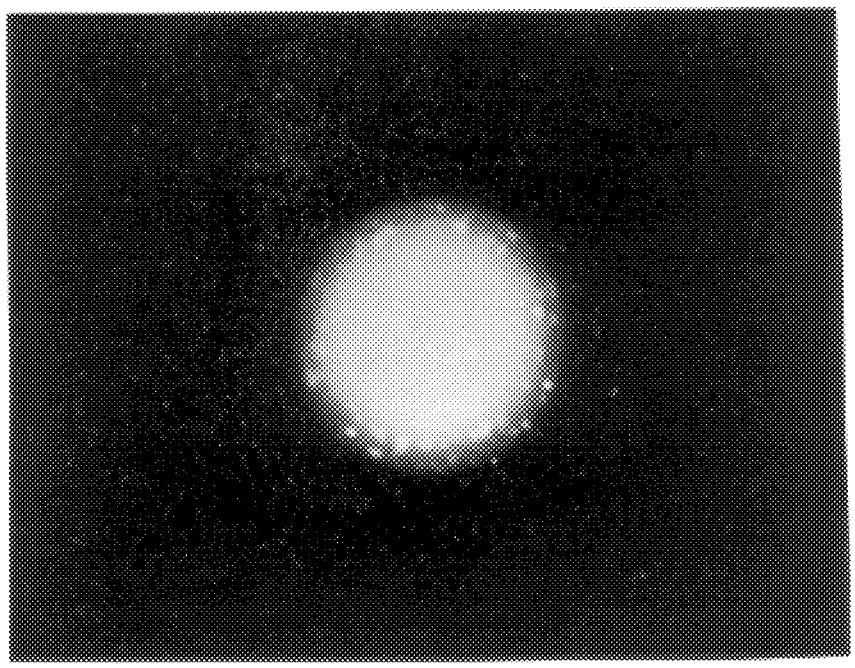
FIG. 13 shows an electron beam diffraction pattern of a C60 cluster particle adhered onto the carbon net.
Figure 14:
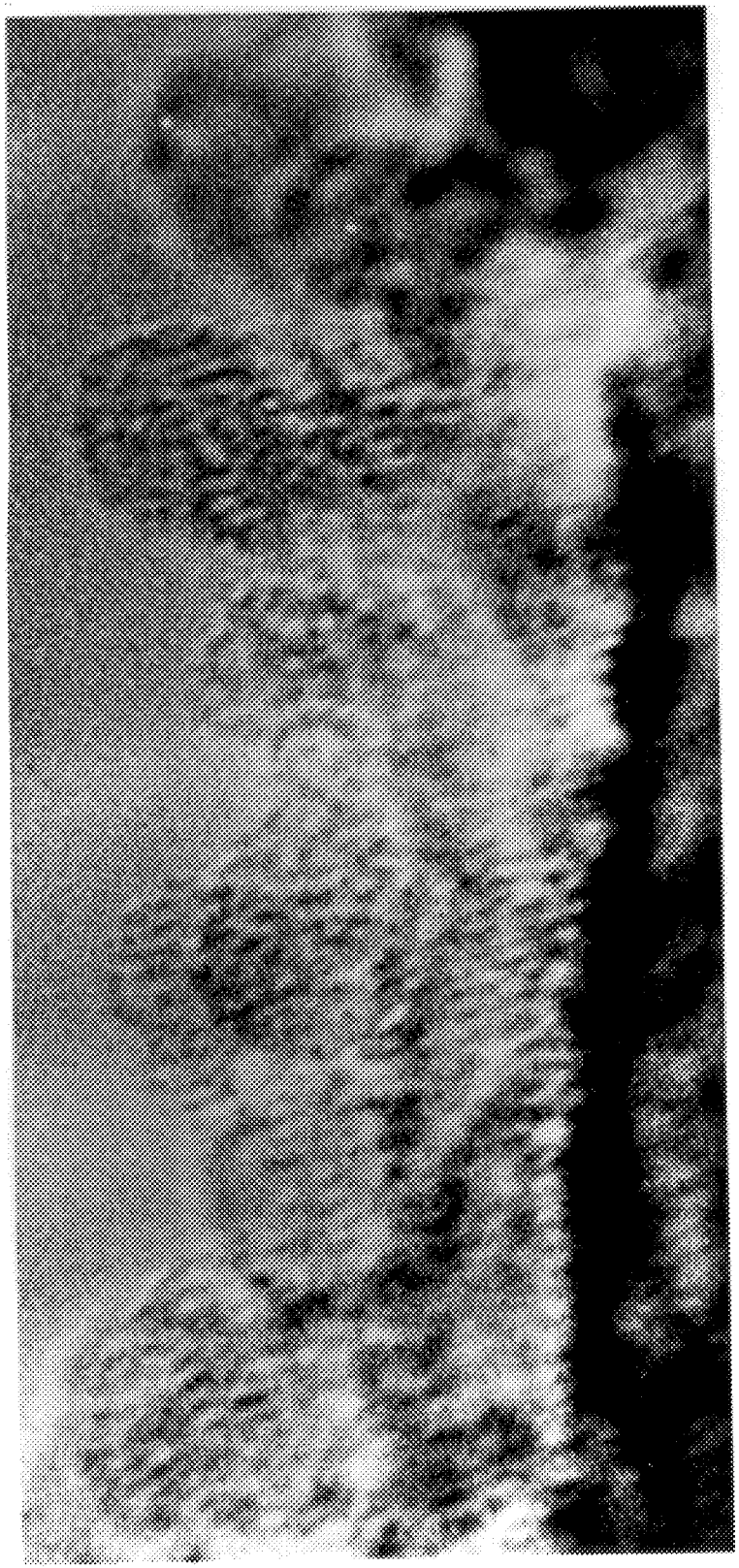
FIG. 14 is a transmission electron microscope photograph of C60 cluster particles on a diamond substrate.

The structure of C60 cluster is shown in FIGS. 12, 13, and 14 in more detail. The specimen was prepared, similarly to that in FIG. 11, ethanol of 10 times vol. was added to a benzene solution of C60 monomer for forming the associated body of C60. Laser was irradiated to the associated body solution, and the cluster formed was put on a carbon net for an electron microscope in FIGS. 12 and 13. FIG. 12 is a transmission electron microscope image showing cluster particles of diameter 30 nm level, while some cluster had diameter of 10 nm level and diameter bigger than 30 nm. Then, an electron beam is focused to a ball-like cluster particle of diameter 30 nm level which is present at slightly left from the center of FIG. 12.

The resultant electron diffraction pattern is shown in FIG. 13, and it is clear that the cluster has the face centered cube (f.c.c.) structure.

A similar sample to that of FIGS. 12, and 13 was deposited onto a surface of diamond and was observed with a transmission electron microscope, as shown in FIG. 14. There are particles of diameter 50 nm or less, in each particle, finer particles corresponding to monomers are observed, and thus it is shown that monomers make ball-like cluster.

What is claimed is:

1. A fullerene cluster compound having a degree of clusterization of 23–24 or 52–53 monomers produced by a method comprising the steps of:

producing an associated body of fullerene monomers, in which said monomers are associated by virtue of a van der Waals force existing between said monomers, by solidifying a solution of fullerene monomers by cooling said solution to a temperature not higher than the freezing point of said solution; and chemically combining said fullerene monomers in said associated body with each other by laser excitation of said associated body.

2. A method for manufacturing a fullerene cluster compound having a degree of clusterization of 5–6, 23–24 or 52–53 monomers comprising the steps of:

producing an associated body of fullerene monomers, in which said monomers are associated by virtue of a van der Waals force existing between said monomers, by solidifying a solution of fullerene monomers by cooling said solution to a temperature not higher than the freezing point of said solution; and thereafter producing a fullerene cluster compound by photo-excitation of said associated body of fullerene so that fullerene monomers in said associated body are chemically combined with each other.

3. A fullerene cluster having only three degrees of clusterization of 5–6, 23–24 and 52–53 monomers produced by the steps of:

producing a plurality of associated bodies of fullerene monomers, in which said monomers are associated by virtue of a van der Waals force existing between said monomers, by solidifying a solution of fullerene monomers by cooling said solution to a temperature not higher than the freezing point of said solution and chemically combining said fullerene monomers in said associated bodies with each other by laser excitation of said associated bodies.

4. A method for manufacturing a fullerene cluster having only three degrees of clusterization of 5–6, 23–24 and 52–53 monomers comprising the steps of:

solidifying a solution of fullerene monomers by cooling said solution to a temperature not higher than the freezing point of said solution to produce a plurality of associated bodies of fullerene monomers, in which said monomers are associated by virtue of a van der Waals force existing between said monomers; and thereafter photo-exciting said associated bodies of fullerene to cause the fullerene monomers in said associated bodies to chemically combine with each other to produce a fullerene cluster.

5. The method of claim 4, further comprising:

increasing the temperature of said solution to less than about 40° K above said freezing point after said cooling step.

6. The method of claim 5, wherein said freezing point is less than about 270° K.

* * * * *